United States Patent [19]
Jin et al.

[11] Patent Number: 5,461,308
[45] Date of Patent: Oct. 24, 1995

[54] MAGNETORESISTIVE CURRENT SENSOR HAVING HIGH SENSITIVITY

[75] Inventors: Sungho Jin, Millington; Mark T. McCormack, Summit, both of N.J.; Apurba Roy, Rockwall; James C. Wadlington, Dallas, both of Tex.

[73] Assignee: AT&T IPM Corp., Coral Gables, Fla.

[21] Appl. No.: 176,366

[22] Filed: Dec. 30, 1993

[51] Int. Cl.$^6$ .................................................. G01R 33/00
[52] U.S. Cl. ................................ 324/117 R; 338/32 R
[58] Field of Search ................... 324/117 R; 338/32 R

[56] References Cited

U.S. PATENT DOCUMENTS

| | | | |
|---|---|---|---|
| 3,519,899 | 10/1967 | Yamada | 317/235 |
| 3,649,912 | 3/1972 | Nakamura | 324/252 |
| 4,228,473 | 10/1980 | Himuro et al. | 360/114 |
| 5,126,667 | 6/1992 | Kataoka et al. | 324/252 |
| 5,159,513 | 10/1992 | Dieny et al. | 324/252 |

FOREIGN PATENT DOCUMENTS

| | | | |
|---|---|---|---|
| 2625322 | 12/1988 | France | G01R 15/20 |
| 0335511 | 3/1989 | United Kingdom | |

OTHER PUBLICATIONS

J. Cho, et al. "Ferromagnetic (LaSr)MnO$_3$ Films Deposited by RF Sputtering" *Japanese Journal of Applied Physics*, vol. 29, No. 9 (1990).

B. E. Jones, "Mean-square ameter and d.c. transformer" *Wireless World*, vol. 77, pp. 17–19 (1970).

*Primary Examiner*—Kenneth A. Wieder
*Assistant Examiner*—Kourosh Cyrus Khosravi
*Attorney, Agent, or Firm*—Glen E. Books

[57] ABSTRACT

The present inventors have discovered that a compact, highly sensitive current sensor can be made for any inductive component having an air gap in its magnetic path by disposing a layer of magnetoresistive material in the path of the fringing magnetic field. In the preferred embodiment, a thin magnetoresistive film of $La_wCa_xMn_yO_z$ on a LaAlO$_3$/Al$_2$O$_3$ substrate provides a high sensitivity in the range of 1–100 mV/ampere of DC current in the inductive component. The current sensor consumes a very small amount of power and provides the desirable electrical isolation between the sensor and the active device circuit.

8 Claims, 2 Drawing Sheets

MAGNETORESISTIVE CURRENT SENSOR HAVING HIGH SENSITIVITY

FIELD OF THE INVENTION

This invention relates to current sensors and, in particular, to a compact magnetoresistive current sensor of high sensitivity.

BACKGROUND OF THE INVENTION

Current sensing is important in many electrical and electronic circuits as a source control signals, including those used in automatic feedback control. However most current sensing elements, especially those based on conductive coils, are bulky or expensive to make. The two well-known current sensor devices are the current-sense transformers and the resistive shunt sensor. The former gives electrical isolation between the sensor and the active device but is generally bulky and expensive. The latter, which measures the IR drop directly from the active circuit, is compact but does not provide isolation between the sensor and the active circuit, and the power loss is high. Accordingly, there is a need for a compact, low-cost current sensor of high sensitivity that also provides electrical isolation.

SUMMARY OF THE INVENTION

The present inventors have discovered that a compact, highly sensitive current sensor can be made for any inductive component having an air gap in its magnetic path by disposing a layer of magnetoresistive material in the path of the fringing magnetic field. In the preferred embodiment, a thin magnetoresistive film of $La_w Ca_x Mn_y O_z$ on a $LaAlO_3/Al_2O_3$ substrate provides a high sensitivity in the range of 1-100 mV/ampere of DC current in the inductive component. The current sensor consumes a very small amount of power and provides the desirable electrical isolation between the sensor and the active device circuit.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
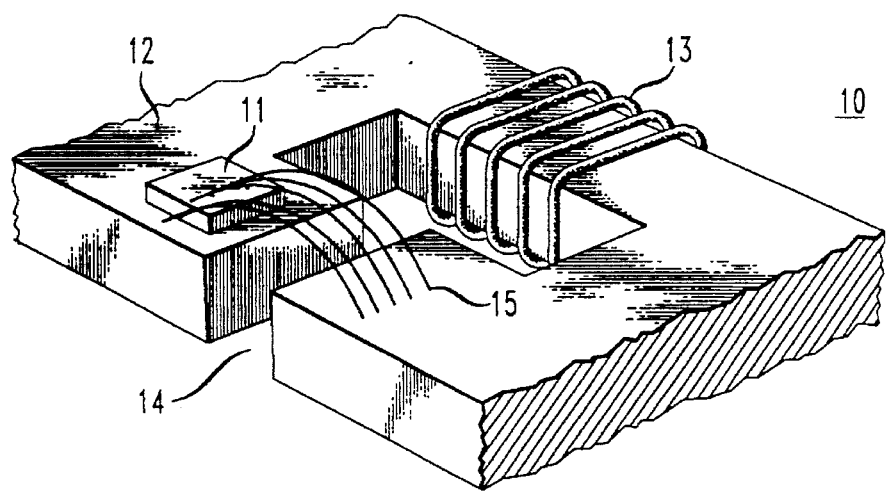
FIG. 1 is a schematic view of an inductive element including a magnetoresistive current sensor device (CSD)

Referring to the drawings, FIG. 1 is a schematic perspective view of a first embodiment of an inductive element 10 including a magnetoresistive current sensor 11 in accordance with the invention. The inductive element, which is conventional, comprises a magnetic core or substrate 12, such as ferrite or iron alloy, a solenoid 13 for generating a magnetic field within the core or substrate 12, and an air gap 14 within an associated fringing flux 15 of the magnetic field. The current sensor 11 is disposed within the fringing flux.

Figure 2:
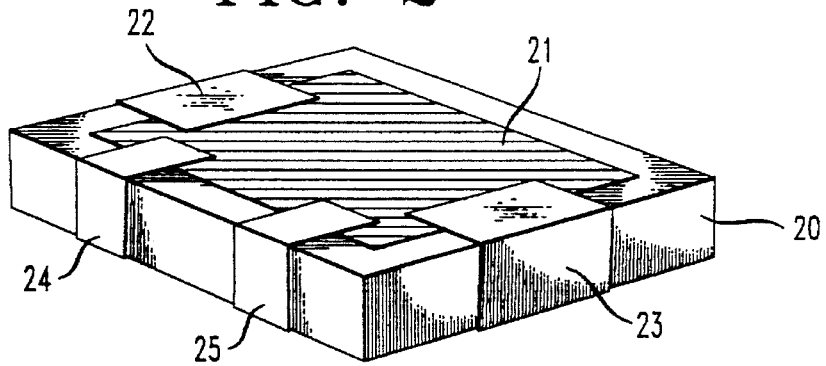
FIG. 2 is an enlarged view of the current sensing element of FIG. 1.

The magnetoresistive current sensor 11 can be four terminal or two terminal. FIG. 2 is an enlarged view of a four terminal sensor comprising an insulating substrate 20, a layer of magnetoresistive material 21 disposed on the substrate, a pair of current electrodes 22, 23 and a pair of voltage electrodes 24, 25 preferably disposed between the current electrodes in a four terminal configuration. In a preferred embodiment the magnetoresistive material is $La_w Ca_x Mn_y O_z$ and the substrate is $LaAlO_3$ or $LaAlO_3/Al_2O_3$ composite.

Fabrication of the preferred magnetoresistive material is described in detail in the co-pending U.S. patent application Ser. No. 08/154,766, filed by S. Jin et al. on Nov. 18, 1993 and entitled "Article Comprising Magnetoresistive Material". A preferred composition layer can be made as follows. A 100 nm thick layer of nominal composition $La_{0.67}Ca_{0.33}MnO_y$ was deposited on a (100) $LaAlO_3$ substrate by laser ablation using a 12 mm diameter×5 mm thick target of the same composition. Other insulating substrates such as $SrTiO_3$ and MgO may also be used. It is preferable to have some epitaxy or at least some c-axis texture for higher magnetoresistance in the film. The ablation was carried out in a partial oxygen atmosphere (100 mTorr). The resulting layer was epitaxial with the substrate and had nominally the same composition as the target. The layer was maintained 3 hours at 900° C. in an oxygen atmosphere in a tube furnace. After removal of the sample from the furnace and cool-down, the magnetoresistive layer exhibited decrease in electrical resistance by more than a factor of 65 times at 77 K. in a field of 6T, parallel to the direction of the current in the layer.

The magnetoresistive sensor material could be in the form of epitaxial or non-epitaxial thin films prepared by physical deposition such as laser ablation, sputtering, evaporation or by chemical deposition such as electroless, electrolytic or chemical vapor deposition or other techniques such as plasma spray or screen printing. Alternatively, thick films or bulk materials can also be used if a sufficiently high signal can be obtained.

Figure 4:
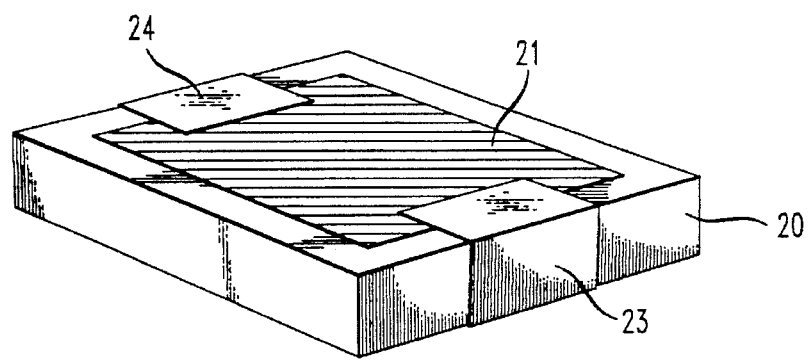
FIGS. 4 and 5 are alternative embodiments of sensing elements.

The electrodes 22–25 can be metallic electrodes deposited and defined by conventional photolithographic techniques. FIG. 4 shows an alternative embodiment of the FIG. 2 current sensor employing two terminals rather than four.

Figure 5:
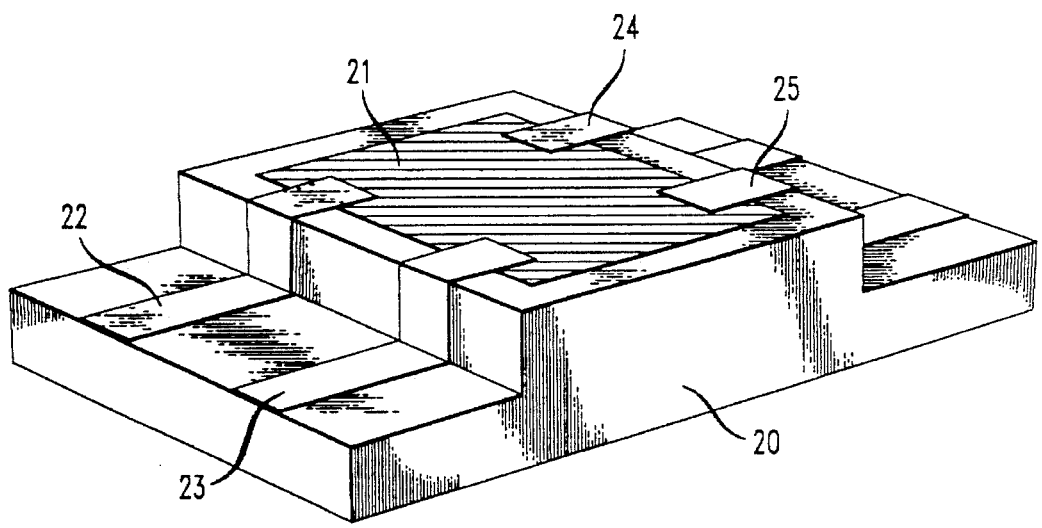
Figure 6:
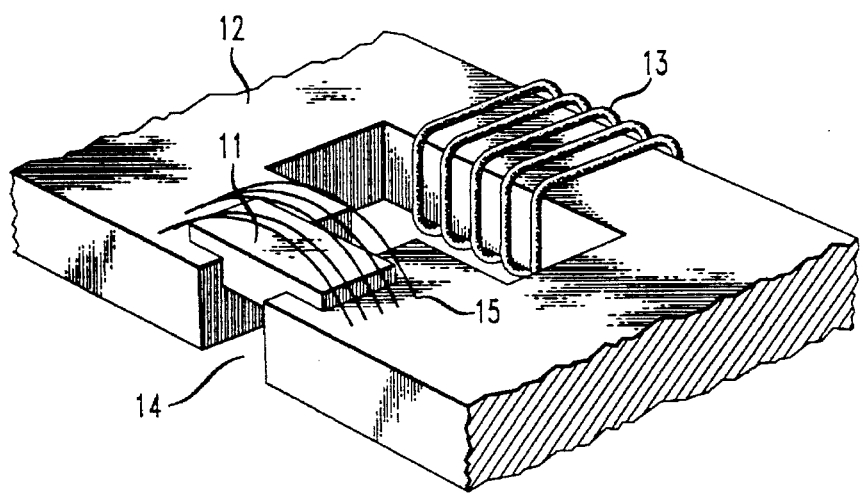
FIG. 6 is an alternative form of the FIG. 1 embodiment showing the current sensor of FIG. 5 extending across an air gap.

FIG. 5 shows yet another alternative embodiment of the FIG. 2 current sensor designed to fit across and optionally into the air gap of the inductive element as shown in FIG. 6. Except for geometry, the device is the same as that shown in FIGS. 1 and 2. The advantage of the FIG. 6 arrangement is that the magnetic field through the sensor is higher, producing a higher output signal. The sensor can also be placed inside the winding on the surface of the core material (within the solenoid). Instead of a separate sensor piece placed near the core, the sensor can also be deposited directly on the surface of the core material such as Ni—Zn or Mn—Zn ferrites as a thin film or thick film. Multiple magnetoresistive elements may sometimes be desirable, for example, to compensate for the temperature variation of the output voltage signal.

In operation, the current electrodes 22, 23 are connected to a source of current in the range 0.001 to 10,000 μA and preferably in the range 0.01 to 2000 μA. The optimal current level can be decided based on specific device design requirement. Voltage is then read between the voltage electrodes 24, 25 in the four terminal sensor or between the current electrodes in the two terminal device. With constant sensor input current, the sensed voltage is essentially proportional to the current in the inductive device.

Figure 3:
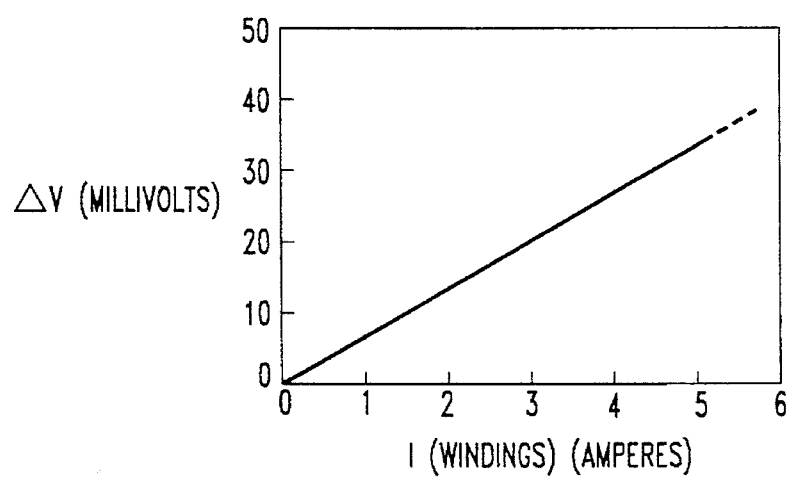
FIG. 3 is a graphical plot of the voltage across the FIG. 2 sensing element as a function of the input current in the Winding of the inductive device.

FIG. 3 is a plot of the voltage change in the magnetoresistive film at 273° K. as a function of the input current in the winding of the inductive device. As can be seen, the voltage change in the sensor film increases linearly with the input current.

While the invention has been described in relation to a preferred magnetoresistive material, more generally the sensor material can be any magnetoresistive material having high electrical resistivity ($\rho > 0.5$ mΩ.cm and preferably $\rho > 5$ mΩ.cm). Such a high resistivity is advantageous for high sensing voltage output at a low input power. Metallic magnetoresistive materials such as Ni-20% Fe (permalloy, $\rho > 0.05$ mΩ.cm), on the other hand, are so conductive that an undesirably very high input current (and hence undesirably large power consumption in the sensor device) has to be employed in order to obtain a significant voltage output signal in the sensor. The material should also have a ferromagnetic Curie temperature higher than the sensor operating temperature, preferably by at least 30° C. Thus for room temperature operation, the material should have a Curie temperature $\geq 330°$ K.

Suitable magnetoresistive films can be made of compounds of the form $A_wB_xC_yO_z$ where A is chosen from one or more rare earth elements (La, Y, Ce, Nd, Sin, Eu, Tb, Dy, Ho, Er, Tin, Yb and Lu). B is chosen from one or more group IIa elements of the periodic table (Mg, Ca, Sr, and Ba), or other elements such as Pb or Cd, and C is chosen from Cr, Mn, Fe and Co. Advantageously, $0.4 \leq w \leq 0.9$, $0.1 \leq x \leq 0.6$, $0.7 \leq y \leq 1.5$, and $2.5 \leq Z \leq 3.5$. Preferably $0.5 \leq w \leq 0.7$, $0.15 \leq x \leq 0.50$, $0.8 \leq y \leq 1.2$, and $2.7 \leq z \leq 3.3$. In a preferred compound, A is La, B is Ca, Sr or Ba, and C is Mn. In a more preferred compound, B is Ca or Ca with partial substitution by Sr or Ba by not more than 40%.

EXAMPLE 1

A leg of rectangular shape ferrite core (picture frame configuration with an air gap slit) was magnetized by passing a DC current into a seven-turn winding on a device such as shown in FIG. 1. The air gap dimension was 5 mm×1.5 mm cross sectional area and ~1 mm wide. A magnetoresistive film of La—Ca—Mn—O, about 3×3 mm area and 1000 Å thick was placed over the air gap with the film side facing the ferrite material (upside down) with an insulating paper in between. The film had four thin lead wires (two for constant current and two for voltage) soldered onto it for four point measurements of the sensing voltages. The fringing magnetic field near the sensing film is estimated to be ~1000 Oe at 5A input current in the winding. The La—Ca—Mn—O film was prepared by pulsed laser deposition using a target with a nominal composition of $La_{0.67}Ca_{0.33}MnO_x$ at about 100 millitorr oxygen partial pressure and at a substrate temperature of about 700° C. A single crystal (100) $LaAlO_3$ substrate, about 3 cm square size, was used. The deposited film was cut to size and heat treated at 900° C./3 hours in oxygen. The electrical resistivity of the film was ~30 milliohm.cm at 273 K. and ~260 milliohm.cm at 77 K. The voltage change in the sensor film increases almost linearly with the input current in the winding. The input of 5A current induces ~2% change in the resistance ($\Delta V$ signal of ~460 mV for input sensor current of ~1 mA) at 77 K. and ~12% change in resistance ($\Delta V$ signal of ~32 mV for input sensor current of ~0.1 mA) at 273 K.

It is to be understood that the above-described embodiments are illustrative of only a few of the many possible specific embodiments which can represent applications of the principles of the invention. Numerous and varied other arrangements can be made by those skilled in the art without departing from the spirit and scope of the invention.

We claim:

1. A current sensing device for sensing the current in an inductive element comprising:

an inductive element for generating a magnetic field in response to an applied current, said inductive element including an air gap and a magnetic fringing field associated with said air gap;

disposed within said magnetic fringing field, a body of high-resistivity magnetoresistive material said body comprising a compound of the form $A_wB_xC_yO_z$ wherein:

A comprises one or more rare earth elements,

B comprises one or more group IIa elements,

C is chosen from one or more elements in the group consisting of Cr, Mn, Fe and Co, and $0.4 \leq w \leq 0.9$, $0.1 \leq x \leq 0.6$, $0.7 \leq y \leq 1.5$ and $2.5 \leq z \leq 3.5$;

and means for sensing change in the resistance of said body of magnetoresistive material.

2. The device of claim 1 wherein $0.5 \leq w \leq 0.7$, $0.15 \leq x \leq 0.50$, $0.8 \leq y \leq 1.2$ and $2.7 \leq z \leq 3.3$.

3. The device of claim 1 wherein said magnetoresistive body comprises $La_wCa_xMn_yO_z$ or $La_w(Ca, Sr, Ba)_xMn_yO_z$ with $0.5 \leq w \leq 0.7$, $0.15 \leq x \leq 0.50$, $0.8 \leq y \leq 1.2$, and $2.7 \leq z \leq 3.3$.

4. The device of claim 3 wherein said magnetoresistive body comprises a thin film layer on a substrate comprising $LaAlO_3$.

5. The device of claim 1 wherein the electrical resistivity of the magnetoresistive material is greater than 0.5 mΩ.cm.

6. The device of claim 1 wherein the applied sensor current is less than 10 mA, and the output voltage in the sensor is at least 1 mV per ampere of the current being sensed when using a sensor current of 0.1 mA.

7. A current sensing device for sensing the current in an inductive element comprising:

an inductive element for generating a magnetic field in response to an applied current, said inductive element including a solenoid;

disposed within said solenoid, a body of high resistivity magnetoresistive material said body comprising a compound of the form $A_wB_xC_yO_z$ wherein:

A comprises one or more rare earth elements,

B comprises one or more group IIa elements,

C is chosen from one or more elements in the group consisting of Cr, Mn, Fe and Co, and $0.4 \leq w \leq 0.9$, $0.1 \leq x \leq 0.6$, $0.7 \leq y \leq 1.5$ and $2.5 \leq z \leq 3.5$.; and means for sensing a change in the resistance of said body of magnetoresistive material.

8. The device of claim 7 wherein $0.5 \leq w \leq 0.7$, $0.15 \leq x \leq 0.50$, $0.8 \leq y \leq 1.2$ and $2.7 \leq Z \leq 3.3$.

* * * * *